(12) United States Patent
Fulton et al.

(10) Patent No.: US 10,830,802 B2
(45) Date of Patent: Nov. 10, 2020

(54) ELECTRIC METER WITH INTERCONNECTION OF DER AND COMMUNICATIONS

(71) Applicant: INFINITE INVENTION INC, Falls Church, VA (US)

(72) Inventors: Whitman Fulton, Arlington, VA (US); Adam Koeppel, Arlington, VA (US); Jon Knauer, Arlington, VA (US); Ben Lewis, Arlington, VA (US); Josh Konstantinos, Arlington, VA (US); John Schroeder, Arlington, VA (US); Al Iaconangelo, Arlington, VA (US)

(73) Assignee: Infinite Invention Inc., Falls Church, VA (US)

( * ) Notice: Subject to any disclaimer, the term of this patent is extended or adjusted under 35 U.S.C. 154(b) by 610 days.

(21) Appl. No.: 15/359,694

(22) Filed: Nov. 23, 2016

(65) Prior Publication Data

US 2017/0212160 A1    Jul. 27, 2017

Related U.S. Application Data

(60) Provisional application No. 62/222,969, filed on Sep. 24, 2015.

(51) Int. Cl.
| | | |
|---|---|---|
| *H02H 3/08* | (2006.01) | |
| *G01R 21/133* | (2006.01) | |
| *H02H 9/04* | (2006.01) | |
| *G01R 22/06* | (2006.01) | |
| *G01R 22/10* | (2006.01) | |

(52) U.S. Cl.
CPC .......... *G01R 21/1333* (2013.01); *H02H 3/08* (2013.01); *H02H 9/04* (2013.01); *G01R 22/063* (2013.01); *G01R 22/065* (2013.01); *G01R 22/068* (2013.01); *G01R 22/10* (2013.01)

(58) Field of Classification Search
CPC ...... G01R 22/063; G01R 22/065; H02H 3/08; H02H 9/04
USPC ........................................................ 361/91.3
See application file for complete search history.

(56) References Cited

U.S. PATENT DOCUMENTS

| | | | | | |
|---|---|---|---|---|---|
| 4,494,163 | A | * | 1/1985 | Yelland | H02H 9/005 361/110 |
| 5,956,223 | A | * | 9/1999 | Banting | H02H 9/044 361/111 |
| 5,994,892 | A | * | 11/1999 | Turino | G01D 4/004 324/142 |
| 2007/0279166 | A1 | * | 12/2007 | VanderVeen | H01H 71/08 335/202 |
| 2011/0021186 | A1 | * | 1/2011 | Fischer | H01Q 1/246 455/424 |
| 2012/0265459 | A1 | * | 10/2012 | Sfaelos | B60L 53/305 702/61 |
| 2012/0278016 | A1 | * | 11/2012 | Huff | G01D 4/004 702/62 |

(Continued)

*Primary Examiner* — Danny Nguyen
(74) *Attorney, Agent, or Firm* — Hamre, Schumann, Mueller & Larson, P.C.

(57) ABSTRACT

A watt-hour meter may include one or more electrical junction points that interface a Distributed Energy Resource to an energy-consuming structure and to the electrical distribution grid, while maintaining compliance with interconnection requirements for safety, power quality and automatic disconnect capabilities.

11 Claims, 3 Drawing Sheets

(56) References Cited

U.S. PATENT DOCUMENTS

| | | | |
|---|---|---|---|
| 2015/0244306 A1* | 8/2015 | Estes | G05B 15/02 |
| | | | 700/287 |
| 2016/0131686 A1* | 5/2016 | Handley | G05F 1/00 |
| | | | 324/76.11 |
| 2016/0131688 A1* | 5/2016 | Carlson | G01R 21/133 |
| | | | 702/61 |
| 2016/0223602 A1* | 8/2016 | Carlson | G01D 4/004 |

* cited by examiner

ELECTRIC METER WITH INTERCONNECTION OF DER AND COMMUNICATIONS

BACKGROUND

Distributed energy resources (DER) are smaller power sources that can be aggregated to provide power necessary to meet regular demand. As the electric grid continues to modernize, DERs such as photovoltaic solar panels, electric vehicles, energy storage batteries and advanced renewable technologies can help facilitate the transition to a smarter grid. Further, as developments in DER technologies progress, associated costs are falling, performance efficiencies are increasing, and demand for greater integration of disparate functionality is rising.

SUMMARY

In an example, a watt-hour meter may include one or more electrical junction points that interface a Distributed Energy Resource to an energy-consuming structure and to the electrical distribution grid, while maintaining compliance with interconnection requirements for safety, power quality and automatic disconnect capabilities.

BRIEF DESCRIPTION OF THE DRAWINGS

The foregoing and other features of this disclosure will become more fully apparent from the following description and appended claims, taken in conjunction with the accompanying drawings. The use of the same reference numbers in different figures indicates similar or identical items. Further, understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
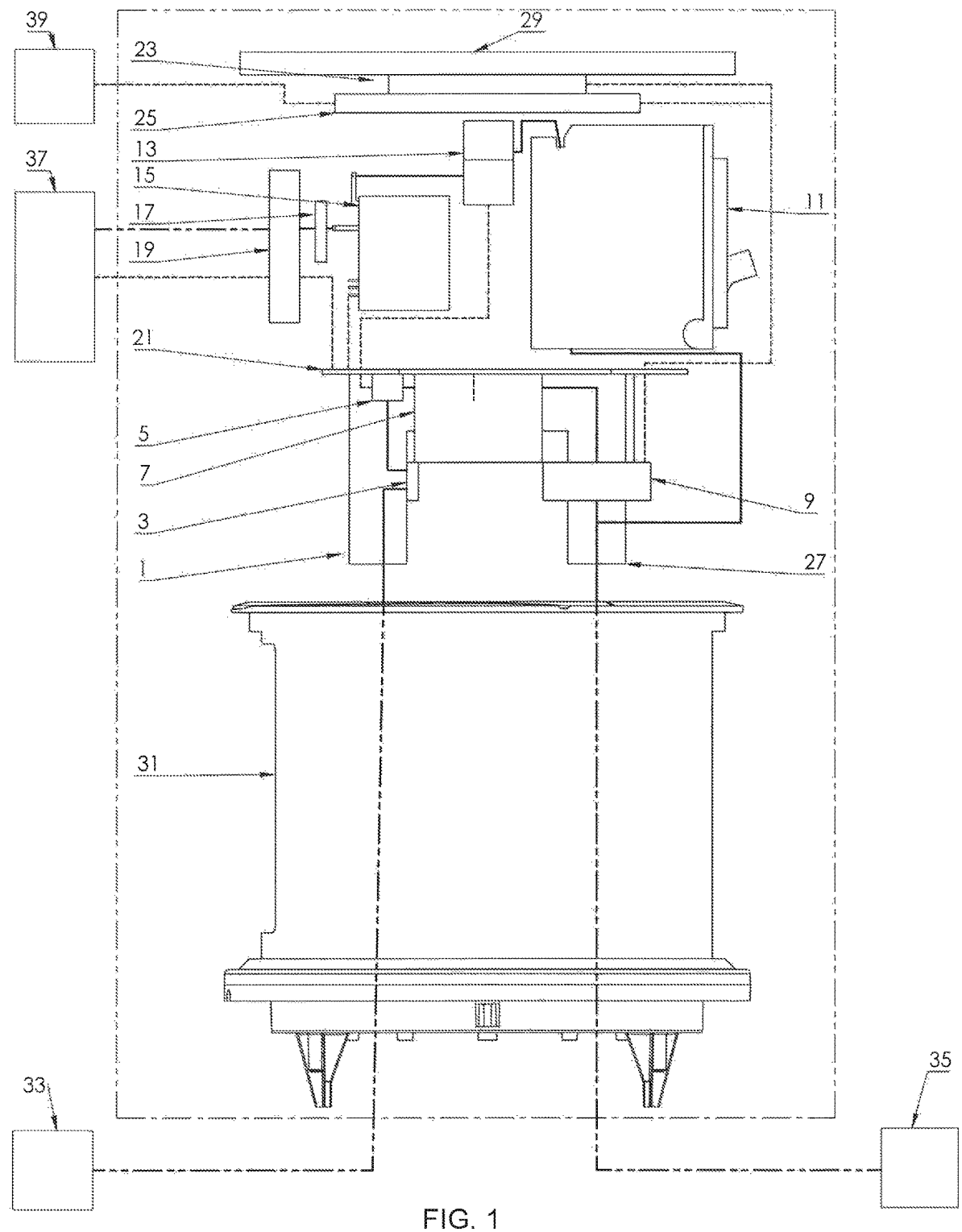
FIG. 1 shows a side view of a junction meter, in accordance with at least some one of the embodiments described herein.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

FIG. 1 shows a side view of junction meter 100. Junction meter 100 facilitates installation of a DER at a customer site to accommodate the DER, as well as the installation of communications and other ancillary equipment, while also complying with safety codes and standards.

Grid blades 1 are electrical interfaces through which electricity from electric power grid 35 may enter.

Surge protection device 3 is a protective device that limits voltage supplied to junction meter 100 by either blocking or shorting to ground any unwanted voltages from the grid 35 above a defined threshold.

Voltage sensors 5 are sensing devices that measure the voltage of power incoming through grid blades 1.

Whole premises relay 7 is a closable switch on a circuit that is used to remotely disconnect premises 33 from electrical grid 35.

Whole premises meter 9 is a metering device that measures power consumed or produced by premises 33.

DER connection point 19 is an interface through which power can also enter meter 100.

Second surge protection device 17 is a protective device that prevents power surges from entering junction meter 100 through DER connection point 19.

DER relay 15 is a closable switch on a circuit that is used to remotely electrically disconnect a DER attached to DER connection point 19.

Current sensor 13 is a sensor that, in combination with voltage sensor 5, measures power produced or consumed by DER.

Overcurrent protection device 11 is a protective device that prevents overcurrents from being drawn through DER connection point 19. Overcurrent protection device 11 can be triggered to disconnect DER connection point 19 from grid 35 and premises 33 under a variety of grid conditions such as voltage spikes.

Core processor 21 is a computing system that combines measurements from voltage sensor 5, current sensor 13, and whole premises meter 9 to gather and compute power consumption and production data for the premises 33 and the DER 37. Core processor 21 also controls whole premises relay 7 and DER relay 15 by sending signals to open or close under a variety of conditions either sensed locally or determined via a signal from a transceiving station 39.

Communications module 25 is a microprocessor and modem that transmits metering data from the junction meter 100 to transceiving station 39, or receives commands from the transceiving station 39. Commands may include but are not limited to: changes to operating parameters such as the rate at which metering systems samples the power flow, and position of control relays. Display module 23 can display relevant metering data. Power is delivered to premises 33 through premises blades 27.

Housing 31 is an enclosure that combines with front cover 29 create a weatherproof containment for the junction meter components.

Figure 2:
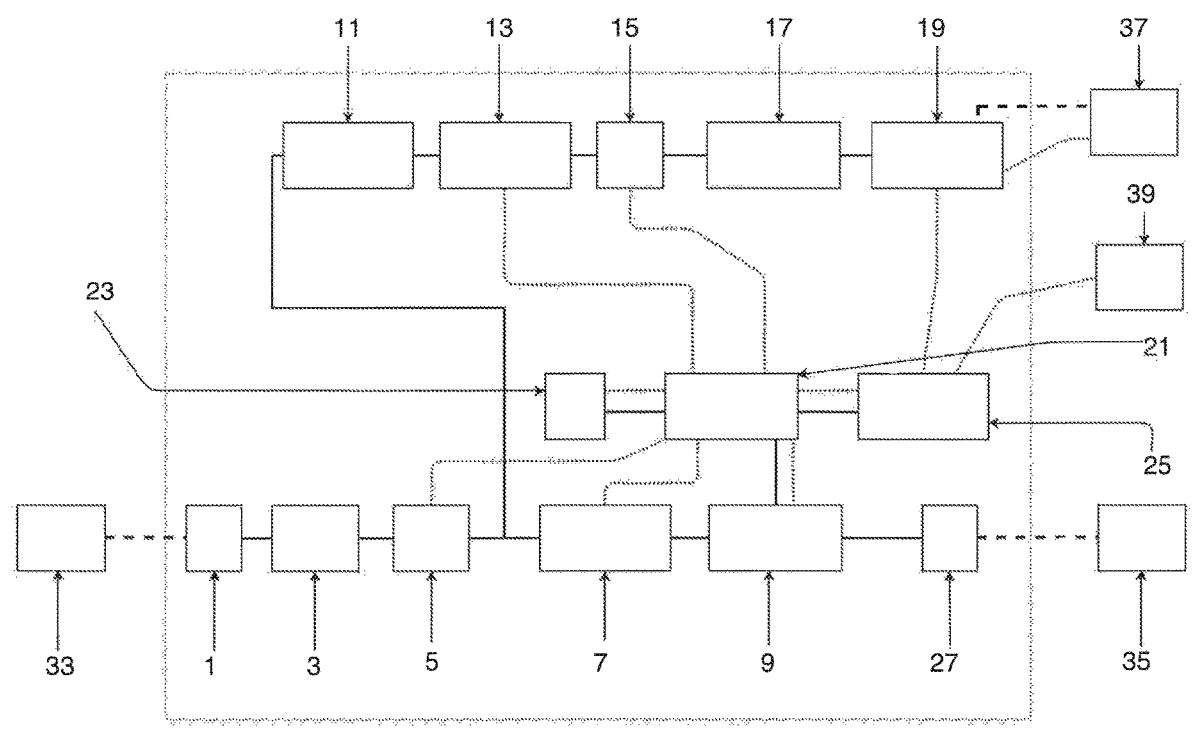
FIG. 2 shows a flow chart representing the electrical and data connections between the various components within a junction meter, configured with a connection to a DER on the grid-side of the whole premises metering circuit, in accordance with at least some one of the embodiments described herein.

FIG. 2 shows a flow chart representing the electrical and data connections between the various components within a junction meter, configured with a connection to a DER on the line-side of the whole premises metering circuit.

Power enters the meter from the grid 35 through grid side blades 1. Surge protection device 3 prevents power surges from the grid from passing into the meter. Voltage sensor 5 measures the voltage of the incoming power. Whole premises relay 7 is capable of remotely disconnecting the premises 33 from the electrical grid. Whole premises meter 9 can measure the power consumed or produced by the premises 33.

Power can also enter the meter through DER connection point 19. A second surge protection device 17 prevents power surges from entering the meter through DER connection point 19. DER relay 15 is capable of remotely disconnecting anything attached to DER connection point 19. Current sensor 13, combined with voltage sensor 5 can measure the power produced or consumed by the DER. Overcurrent protection device 11 can prevent overcurrents from being drawn through DER connection point 19. Overcurrent protection device 19 can also be manually triggered to electrically disconnect DER connection point 11 from the grid 35 and premises 33.

Core processor 21 combines measurements from voltage sensor 5, current sensor, 13, and whole premises meter 9 to gather and compute power consumption and production data for the premises 33 and the DER 37. Core processor 21 can also control whole premises relay 7 and DER relay 15. Communications module 25 can transmit data from the junction meter to a transceiver station 39, or receive commands from a transceiver station 39. Display module 23 can display relevant metering data. Whole premise blades 27 connect the meter to the premises electrical system 33.

The electrical power connection with the DER takes place between the voltage sensor 5, the whole premises relay 7, and the DER connection point 11.

Figure 3:
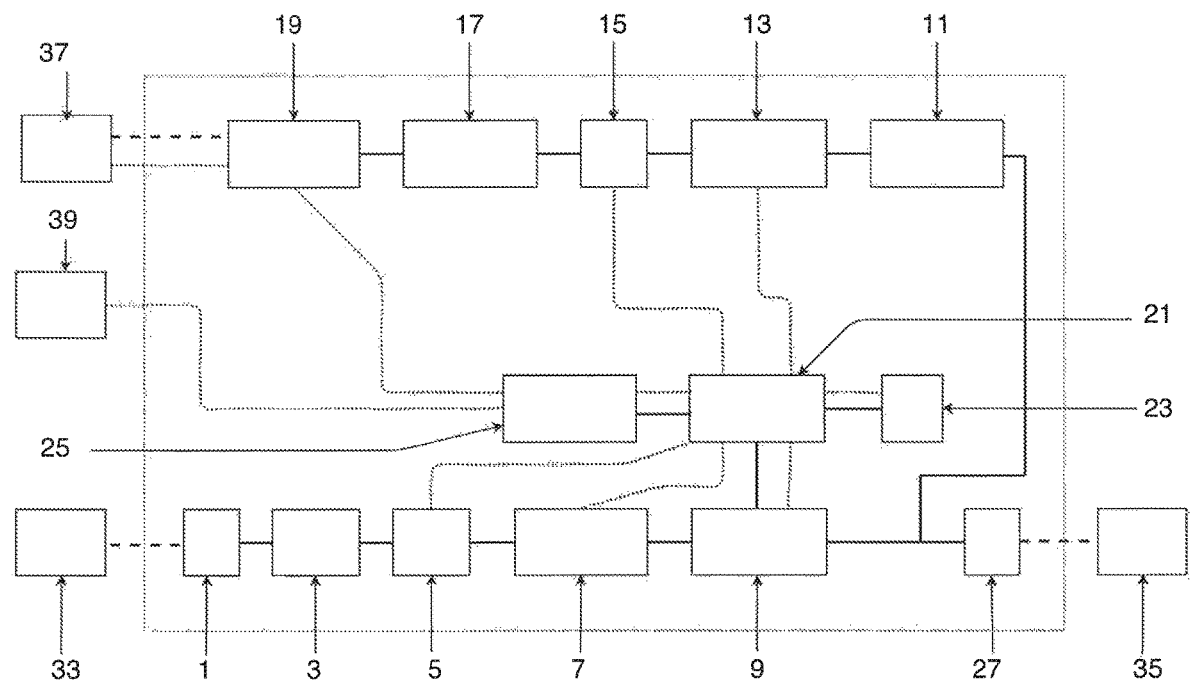
FIG. 3 shows a flow chart representing the electrical and data connections between the various components within a junction meter, configured with a connection to a DER on the premises-side of the whole premises metering circuit, in accordance with at least some one of the embodiments described herein.

FIG. 3 shows a flow chart representing the electrical and data connections between the various components within a junction meter, configured with a connection to a DER 37 on the premises-side of the whole premises metering circuit.

Power enters the meter through grid side blades 1. Surge protection device 3 prevents power surges from the grid from passing into the meter. Voltage sensor 5 measures the voltage of the incoming power. Whole premises relay 7 is capable of remotely disconnecting the premises from the electrical grid 35. Whole premises meter 9 can measure the power consumed or produced by the premises.

Power can also enter the meter through DER connection point 19. A second surge protection device 17 prevents power surges from entering the meter through DER connection point 19. DER relay 15 is capable of remotely disconnecting anything attached to DER connection point 19. Current sensor 13, combined with voltage sensor 5 can measure the power produced or consumed by the DER. Overcurrent protection device 11 can prevent dangerous overcurrents from being drawn through DER connection point 19. Overcurrent protection device 19 can also be manually triggered to disconnect DER connection point 11 from the grid and premises.

Core processor 21 combines measurements from voltage sensor 5, current sensor, 13, and whole premises meter 9 to gather and compute power consumption and production data for the premises and the DER. Core processor 21 can also control whole premises relay 7 and DER relay 15. Communications module 25 can transmit data from the junction meter to a receiving station, or receive commands from a transmitting station. Display module 23 can display relevant metering data. Whole premise blades 27 connect the meter to the premises electrical system.

The electrical power connection with the DER takes place between the whole premise meter 9, the overcurrent protection device 11, and the whole premise blades 27.

We claim:

1. A junction meter that houses junction meter components, the junction meter components comprising:
   at least one premises meter that measures power production or power consumption of a premises;
   at least one electrical interconnection point allowing the connection of a Distributed Energy Resource (DER) to a circuit within the junction meter that provides an electrical path to the premises and the grid;
   at least one DER meter that measures power production or power consumption of the connected DER; and
   at least one remote controllable relay to disconnect either of the DER or the premises from the grid,
   wherein the junction meter houses the junction meter components in a weatherproof containment in the form factor of a watt-hour meter.

2. The junction meter of claim 1, further comprising
   at least one wired or wireless machine-to-machine data communications component that transmits data regarding electrical characteristics gathered from the at least one premises meter, and data gathered from the at least one DER meter.

3. The junction meter of claim 2, wherein the junction meter is installed on the premises.

4. The junction meter of claim 1, further comprising:
   at least one overcurrent protection device to prevent overcurrent draw through the at least one electrical interconnection points.

5. The junction meter of claim 1, including:
   at least one disconnect device to allow the at least one electrical interconnection point to be electrically isolated from the grid.

6. The junction meter of claim 5, wherein the at least one disconnect device to allow the at least one electrical interconnection point to be manually electrically isolated from the grid is combined with an overcurrent device.

7. The junction meter of claim 1, further comprising:
   at least one data display screen that shows metering data, operational states, error codes, or other relevant data generated by the premises and DER meters.

8. The junction meter of claim 1, further comprising:
   at least one grid or line side electrical interconnection point.

9. The junction meter of claim 1, further comprising:
   at least one premises or load side electrical interconnection point.

10. The junction meter of claim 1, further comprising:
    at least one electrical surge protection device to prevent power surges from entering the meter from the grid or line side.

11. The junction meter of claim 1, further comprising:
    at least one electrical surge protection device to prevent power surges from entering the meter through the at least one electrical interconnection point.

* * * * *